United States Patent
Conti et al.

(10) Patent No.: US 7,084,079 B2
(45) Date of Patent: Aug. 1, 2006

(54) METHOD FOR LOW TEMPERATURE CHEMICAL VAPOR DEPOSITION OF LOW-K FILMS USING SELECTED CYCLOSILOXANE AND OZONE GASES FOR SEMICONDUCTOR APPLICATIONS

(75) Inventors: Richard A. Conti, Katonah, NY (US); Daniel C. Edelstein, White Plains, NY (US); Gill Yong Lee, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 10/299,357

(22) Filed: Nov. 18, 2002

(65) Prior Publication Data

US 2003/0068853 A1 Apr. 10, 2003

Related U.S. Application Data

(62) Division of application No. 09/928,209, filed on Aug. 10, 2001, now Pat. No. 6,531,412.

(51) Int. Cl.
*H01L 21/469* (2006.01)

(52) U.S. Cl. .................. 438/786; 438/787; 438/778; 438/758

(58) Field of Classification Search .......... 438/676, 438/623, 627, 687, 780
See application file for complete search history.

(56) References Cited

U.S. PATENT DOCUMENTS

| | | |
|---|---|---|
| 5,545,436 A | 8/1996 | Saito |
| 5,710,079 A | 1/1998 | Sukharev |
| 5,855,957 A | 1/1999 | Yuan |
| 5,858,876 A | 1/1999 | Chew |
| 5,972,803 A | 10/1999 | Shu et al. |
| 5,976,993 A | 11/1999 | Ravi et al. |
| 6,030,460 A | 2/2000 | Sukharev |
| 6,068,884 A | 5/2000 | Rose et al. |
| 6,159,871 A | 12/2000 | Loboda et al. |
| 6,348,099 B1 * | 2/2002 | Xia et al. .................. 118/697 |
| 6,656,837 B1 * | 12/2003 | Xu et al. .................. 438/676 |

FOREIGN PATENT DOCUMENTS

| | | |
|---|---|---|
| EP | 0 960 958 A2 | 1/1999 |
| JP | 04-290436 | 10/1992 |
| JP | 06-283515 | 10/1994 |

* cited by examiner

*Primary Examiner*—Dung A. Le
(74) *Attorney, Agent, or Firm*—Ira D. Blecker

(57) ABSTRACT

A method is described for forming a low-k dielectric film, in particular, a pre-metal dielectric (PMD) on a semiconductor wafer which has good gap-filling characteristics. The method uses a thermal sub-atmospheric CVD process that includes a carbon-containing organometallic precursor such as TMCTS or OMCTS, an ozone-containing gas, and a source of dopants for gettering alkali elements and for lowering the reflow temperature of the dielectric while attaining the desired low-k and gap-filling properties of the dielectric film. Phosphorous is a preferred dopant for gettering alkali elements such as sodium. Additional dopants for lowering the reflow temperature include, but are not limited to boron, germanium, arsenic, fluorine or combinations thereof.

30 Claims, 4 Drawing Sheets

METHOD FOR LOW TEMPERATURE CHEMICAL VAPOR DEPOSITION OF LOW-K FILMS USING SELECTED CYCLOSILOXANE AND OZONE GASES FOR SEMICONDUCTOR APPLICATIONS

CROSS-REFERENCE TO RELATED PATENT APPLICATIONS

This Patent Application is a Divisional Patent Application of U.S. patent application Ser. No. 09/928,209, filed on Aug. 10, 2002.

FIELD OF THE INVENTION

The present invention relates to semiconductor processing, and more particularly to a process for forming a blanket dielectric layer to fill gaps between device elements.

BACKGROUND OF THE INVENTION

In the manufacturing of semiconductor devices, as the dimensions have shrunk, it has become more challenging to provide dielectric film layers that provide adequate electrical isolation between interconnect features and device components in order to minimize RC delay and crosstalk. One method of doing this is to provide dielectric layers using materials having lower dielectric constants (low-k dielectrics) than conventional dielectric materials such as silicon dioxide ($SiO_2$) or silicon nitride. Low-k dielectrics typically have dielectric constants below about 4, where air has a dielectric constant of 1.

In particular, at the start of the fabrication of a back end of line (BEOL) module which contains the interconnect metal levels, a dielectric layer is typically provided between the devices or features, such as gate conductor stacks, on the substrate, or front end of line (FEOL), and the first layer of metal in the interconnect level or BEOL. This dielectric layer between the device level and the interconnect level is known as the pre-metal dielectric (PMD). The process of forming this PMD is referred to hereinafter as a middle of line process, or MOL process, as opposed to the BEOL processes used to form the intermetal dielectrics (IMD) that separate the metal layers.

Methods of depositing low-k dielectric blanket layers have included spin-on, chemical vapor deposition (CVD), and plasma-enchanced chemical vapor deposition (PECVD), with PECVD more recently preferred. PECVD processes include the use of organosilicon precursors, such as methylsilane (1MS), trimethyl silane (3MS) and tetramethylsilane (4MS), with various oxidizers. However, the CVD processes, in particular PECVD, may not adequately fill the spaces or gaps between existing metal features, and may leave voids in the dielectric blanket layer which can cause problems such as micro-cracking, lack of structural support, trapping of gases or moisture or allow subsequent metal fill processes to connect nearby voids which can result in shorted device elements. Although films provided by spin-on deposition may adequately fill spaces or gaps, these films are usually porous and would be incompatible with other MOL processing steps by being susceptible to problems such as those mentioned above. The problem of adequate gap fill can be particularly difficult if the aspect ratio (AR), which is the ratio of height to width of the gaps, is above about 1.0. For example, referring to FIG. 1, device structures 130 are formed over a doped region 120 on a substrate 110. The device structures 130, such as gate conductor stacks, are separated by width W and each have height H. Therefore the gap 160 separating the device structures 130 has an aspect ratio (AR) of H/W. If H is greater than W, then the AR is greater than 1 and a blanket dielectric layer 140 formed by a conventional PECVD process will not completely fill the gap 160, leaving a void 150, which can cause problems such as structural and electrical defects as mentioned above.

PECVD methods for depositing low-k dielectric layers for BEOL levels have been suggested which use a carbon-containing precursor, for example, a cyclosiloxane such as tetramethylcyclo-tetrasiloxane (TMCTS) or methylsilanes, with oxygen. Low-k dielectrics will also be required at the MOL level. PECVD can provide deposition rates which are fast enough (in the range of 100's to 1000's Å/min) for BEOL applications which must operate at temperatures below about 400° C., and as low as 300° C., because of the presence of metal features. However, PECVD solutions at the MOL level are not easily utilized, because PECVD processes may leave voids in high aspect ratio gaps, where the gap AR exceeds about 1.0. In addition, plasma processing is not a preferred fill method for MOL as it may cause charge damage to gate oxides.

Thermal CVD processes do not require the use of plasmas to deposit dielectric layers. Sub-atmospheric thermal CVD (SACVD) and low pressure thermal CVD have been used for providing conformal deposition of dielectrics, in which $O_3$ and $O_2$ are respectively used as oxidizing agents. The pressure in SACVD is in the range from about 50 to 800 Torr, and usually between about 200 to 760 Torr. Low pressure CVD typically involves pressures below about 10 Torr. Low pressure CVD will not provide good gap filling results for chemistry such as oxygen plus an organometallic or organosilicon precursor such as TMCTS. Good gap filling typically results through the use of SACVD at pressures above about 200 Torr, and more likely above about 600 Torr. However, using low-k materials for AR greater than 1, SACVD may also leave voids depending on the shape of the gap to be filled.

It would be desirable to use a post-deposition glass reflow step at a low reflow temperature to fill voids left after deposition of a low-k film with minimal heat treatment to avoid thermal damage. For example, in the case of conventional (high-k) dielectric films where controlling the dielectric constant has not been a design requirement, it is known that the addition of dopants may lower the temperature required to reflow the film. However, because the process conditions for depositing low-k films that would also provide good gap-filling results are quite sensitive to the composition of reactant gases and the structure of the gaps to be filled, the addition of dopants which reduce the reflow temperature would not necessarily preserve the desired low-k and gap-filling properties of the film, and may require significant experimentation to achieve the desired results.

Thus, there is a need for a non-plasma low-k oxide CVD process that can provide good gap-filling results for AR greater than 1, that avoids charge damage, that can getter alkali elements, that can be reflowed with minimal heat treatment to avoid thermal damage to the underlying device elements, and that provides a film having the desired low-k property.

Sukharev (U.S. Pat. No. 5,710,079, hereinafter, the Sukharev patent) discloses a method for depositing silicon dioxide films to prevent the formation of voids in gaps by CVD with an organometallic compound, such as tetraethylorthosilicate (TEOS), BPTEOS, TEB, TMOP, OMCTS, HMDS, TMCTS, or TRIES, and which includes ozone and the use of ultraviolet radiation (UV) to increase the deposition rate by increasing the concentration of hydroxyl radicals in order to avoid the formation of voids and improve gap-fill. However, the increased concentration of hydroxyl radicals may lead to a porous film that is incompatible with MOL processing and increased concentration of hydroxyl radicals will result in reduced carbon incorporation in the film. Since carbon incorporation is required to achieve a low-k oxide, the Sukarev patent does not provide a solution for depositing low-k dielectric films that provide good gap filling results. Moreover, the use of UV radiation to increase deposition rates may require modification of standard reaction chambers and may increase the cost of processing.

Yuan (U.S. Pat. No. 5,855,957, hereinafter, the Yuan patent) discloses a method for depositing an oxide thin film using an atomospheric pressure thermal CVD (APCVD) process including ozone ($O_3$) which can provide uniform step coverage. The Yuan patent discloses the use of precursors such as tetraethoxysilane (TEOS), hexamethyldisilazane (HMDSO), octamethylcyclotetrasiloxane (OMCTS), 2,4,6,8-tetramethylcyclotetrasiloxane (TMCTS), substances of the general formula $SiH_x(OR)_{4-x}$ where "R" is an alkyl group or its oligomers and x=0, 1, 2, or 3, and other chemicals such as boron, phosphorous, fluorine containing sources and combinations thereof. The method of the Yuan patent discloses that uniform step coverage or gap fill can be provided for AR up to about 3. In addition, the preferred embodiment of the Yuan patent requires movement of the wafer through the reactor, which adds to the complexity of the reactor design. Movement of the wafer also results in variation in elemental composition with depth across the substrate and therefore the etch rate will vary with depth, which is incompatible with MOL processing steps such as wet HF etch. In addition, the Yuan patent is not directed to the deposition of low-k dielectric films, which would require strict compositional and density control that is beyond the capability of the Yuan patent.

Saito (U.S. Pat. No. 5,545,436, hereinafter, the Saito patent) discloses an atmospheric CVD method including $O_3$ for depositing an undoped silicon oxide film using a precursor such as TEOS, OMCTS, tetra propoxy silane (TPOS), or TMCTS. The Saito patent also requires the movement of the wafer relative to the gas injector, adding complexity to the reactor design and suffers from similar compositional deficiencies as in the Yuan patent. Therefore, the Saito patent is not suitable for the deposition of low-k dielectrics that provide good gap-filling for AR greater than about 3.

Rose et al. (U.S. Pat. No. 6,068,884, hereinafter, the Rose patent) discloses a method for depositing a low-k dielectric film using a PECVD process. The Rose patent discloses the use of precursors of organosilicon, such as siloxanes, to form an inorganic/organic hybrid dielectric material having a low-k (less than 4.0, and preferably in the range 3.0 to 1.5) and good thermal stability at temperatures in the range of 425–450° C. The precursors disclosed in the Rose patent include organic siloxanes, fluorosiloxanes, cyclosiloxanes, fluorine containing cyclosiloxanes, organosilazanes, fluorosilazanes, cyclosilazane, silicates, TEOS, and TMS and mixtures thereof. Although the Rose patent suggests that either atmospheric, subatmospheric, or low pressure thermal CVD processes may be used, the preferred embodiments of the Rose patent require the use of a plasma CVD process with organosilicon precursors such as hexamethyl disiloxane (HMDSO), 1,1,3,3-tetramethyldisiloxane (TMDSO), TEOS, and OMCTS. Thus, the method of the Rose patent does not recognize the disadvantage of potential charge damage due to the use of plasma CVD processes. The Rose patent also does not solve the problem of gap-fill for AR greater than 1.

Ravi et al. (U.S. Pat. No. 5,976,993, hereinafter, the Ravi patent) discloses a method for depositing silicon oxide films with reduced instrinsic stress which can also provide good gap-fill results using a high density plasma chemical vapor deposition (HDP-CVD) process. Since the Ravi patent teaches the use of a PECVD process and does not suggest the use of a carbon-containing cyclosiloxane precursor such as TMCTS or OMCTS, the Ravi patent is not suitable for depositing low-k dielectric films which have good gap fill characteristics for AR greater than about 1. Also, the method of the Ravi patent suffers from potential charge damage due to plasma processing.

Laboda et al. (EP 0 960 958 A2, hereinafter, the Laboda reference) discloses a method for depositing low-k dielectric films using a plasma enhanced CVD (PECVD) or ozone enhanced CVD process using a methyl-containing silane, such as methylsilane, dimethylsilane, trimethylsilane and tetramethylsilane, and an oxygen providing gas. The Laboda reference also suggests that dopants such as phosphine or diborane, halogens such as fluorine may be used, but does not suggest what advantages such dopants might provide. The Laboda reference also does not recognize the problem of potential charge damage due to plasma processes. In addition, the method of the Laboda reference does not provide good gap-filling characteristics for AR greater than about 1.

In view of the foregoing discussion, there is a need to provide for a method to deposit a low-k dielectric PMD layer that can fill high aspect ratio (AR greater than about 3) gaps without voids, without charge or thermal damage to the semiconductor devices and provides gettering of alkali elements.

SUMMARY OF THE INVENTION

The present invention addresses the above-described need by providing a method for depositing a pre-metal low-k dielectric that provides good gap fill, minimizes the formation of voids, and getters alkali elements such as sodium and potassium.

It is the further object of the present invention to provide a method for forming a pre-metal low-k dielectric by a process which will not cause thermal damage to the semiconductor devices by keeping the process temperature within the thermal budget of the devices.

This invention has the further objective of forming a pre-metal low-k dielectric by a process which will not cause charge damage to the semiconductor devices.

According to one aspect of the present invention, a method is provided for forming a pre-metal (PMD) low-k dielectric layer by a thermal sub-atmospheric chemical vapor deposition process including a carbon-containing precursor, ozone, and a source of dopants.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In the following descriptions of the preferred embodiments of the invention, a method for depositing a pre-metal dielectric layer at middle of line will be detailed. It will be appreciated that this is intended as an example only, and that the invention may be practiced under a variety of conditions and using a variety of precursors.

In a preferred embodiment of the present invention, the method of forming a pre-metal (PMD) low-k dielectric layer uses a thermal sub-atmospheric chemical vapor deposition process which includes a carbon-containing organometallic or organosilicon precursor, ozone, and a source of dopants. The carbon-containing organometallic or organosilicon precusors may include a cyclosiloxane such as tetramethycyclo-tetrasiloxane (TMCTS) or orthomethylcyclo-tetrasiloxane (OMCTS), or other cyclic siloxanes. A dielectric constant of less than about 3.0 is expected due to the carbon content provided by the precursor and the microstructure of the film thereby provided. A phosphorous dopant is added to getter alkali metals such as sodium and potassium. In addition to phosphorous, a dopant is added that allows the film to reflow relatively easily at a temperature and process time that will not lead to thermal damage. As the AR increases, the formation of voids becomes more likely, and some reflow may be necessary. For 0.1μ generation devices, the thermal reflow cycle is preferably in the range of temperature less than about 725° C. for about 20 minutes, which will not cause thermal damage at the PMD level. In a preferred embodiment of the present invention, dopants such as phosphorous and boron are added which will lower the reflow temperature required to fill a given AR gap without thermal damage. Phosphorous is required in order to getter alkali elements, and also acts to lower the reflow temperature to some extent, but typically not sufficiently to avoid thermal damage. Additional dopants that act to further lower the reflow temperature include, but are not limited to boron, germanium, arsenic, fluorine or combinations thereof.

Figure 1:
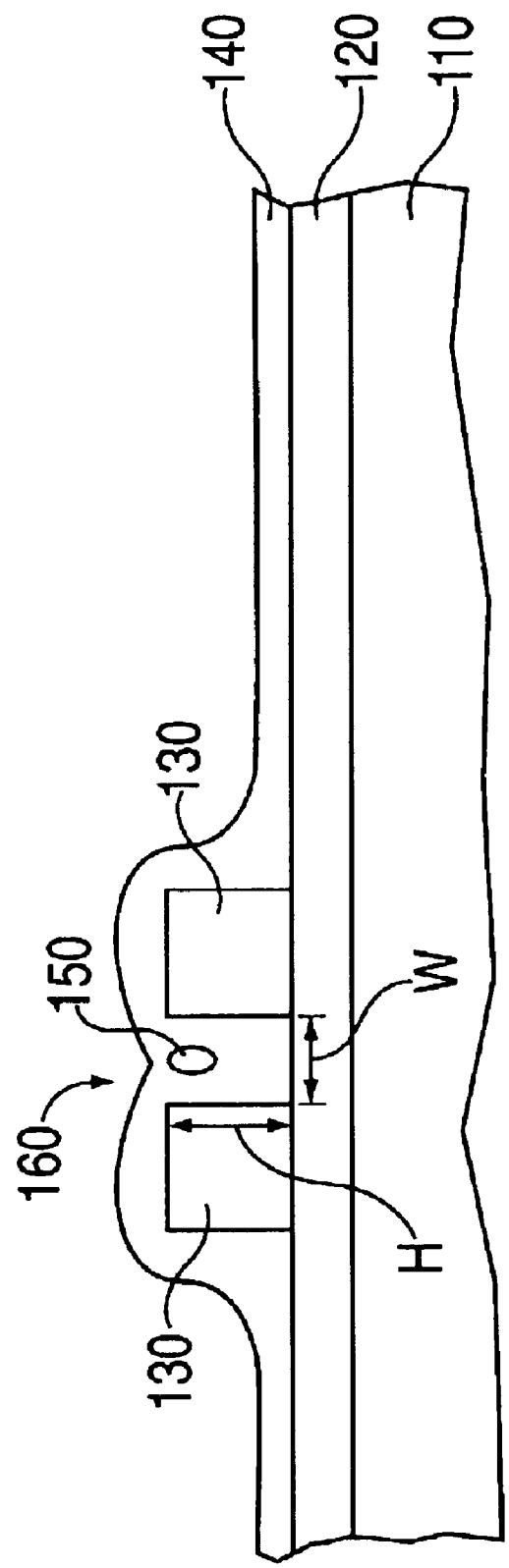
FIG. 1 illustrates a prior art blanket dielectric layer having a void.
Figure 2:
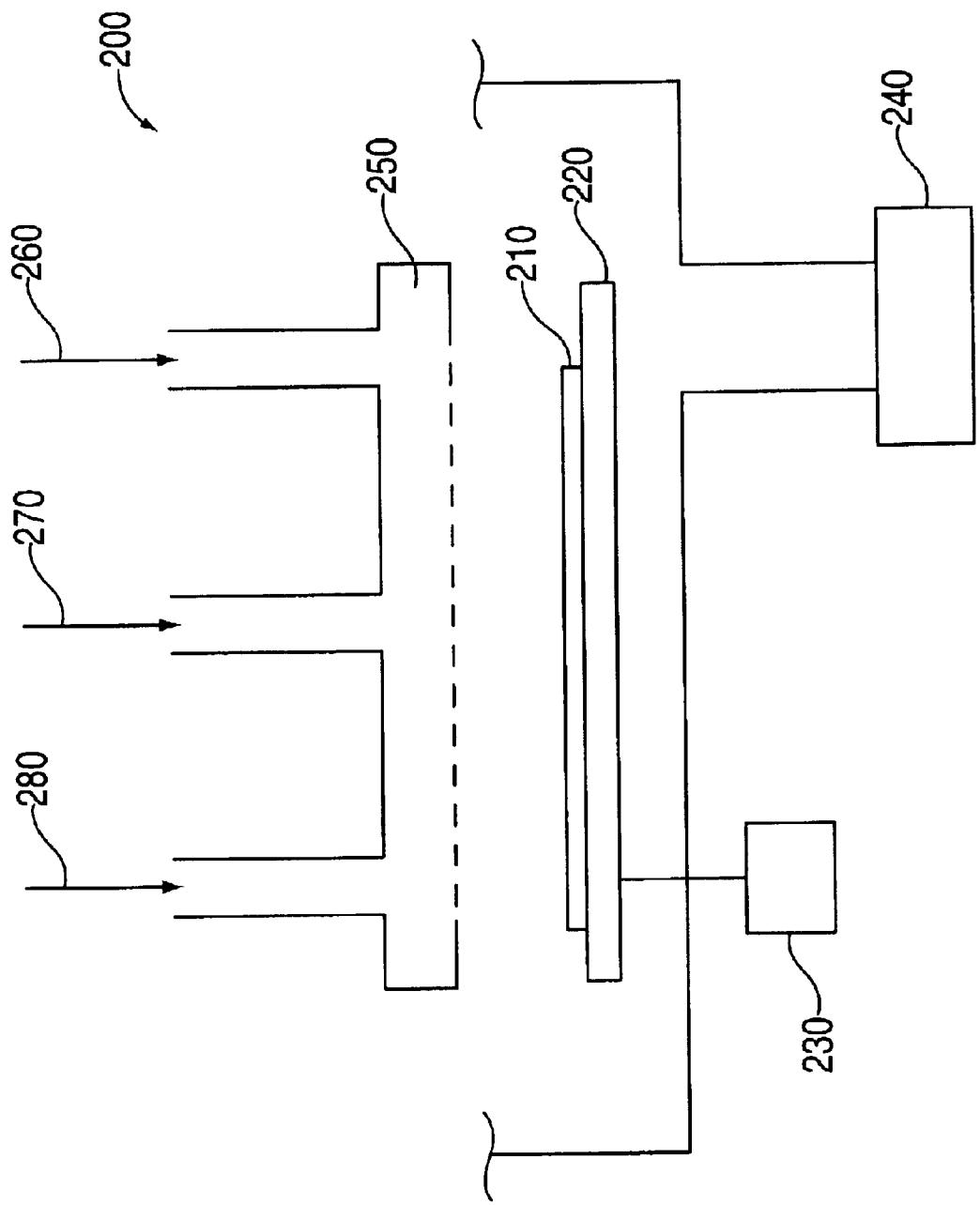
FIG. 2 illustrates a single wafer CVD reactor which can be used to implement the process of depositing a pre-metal dielectric layer in accordance with the present invention.
Figure 3:
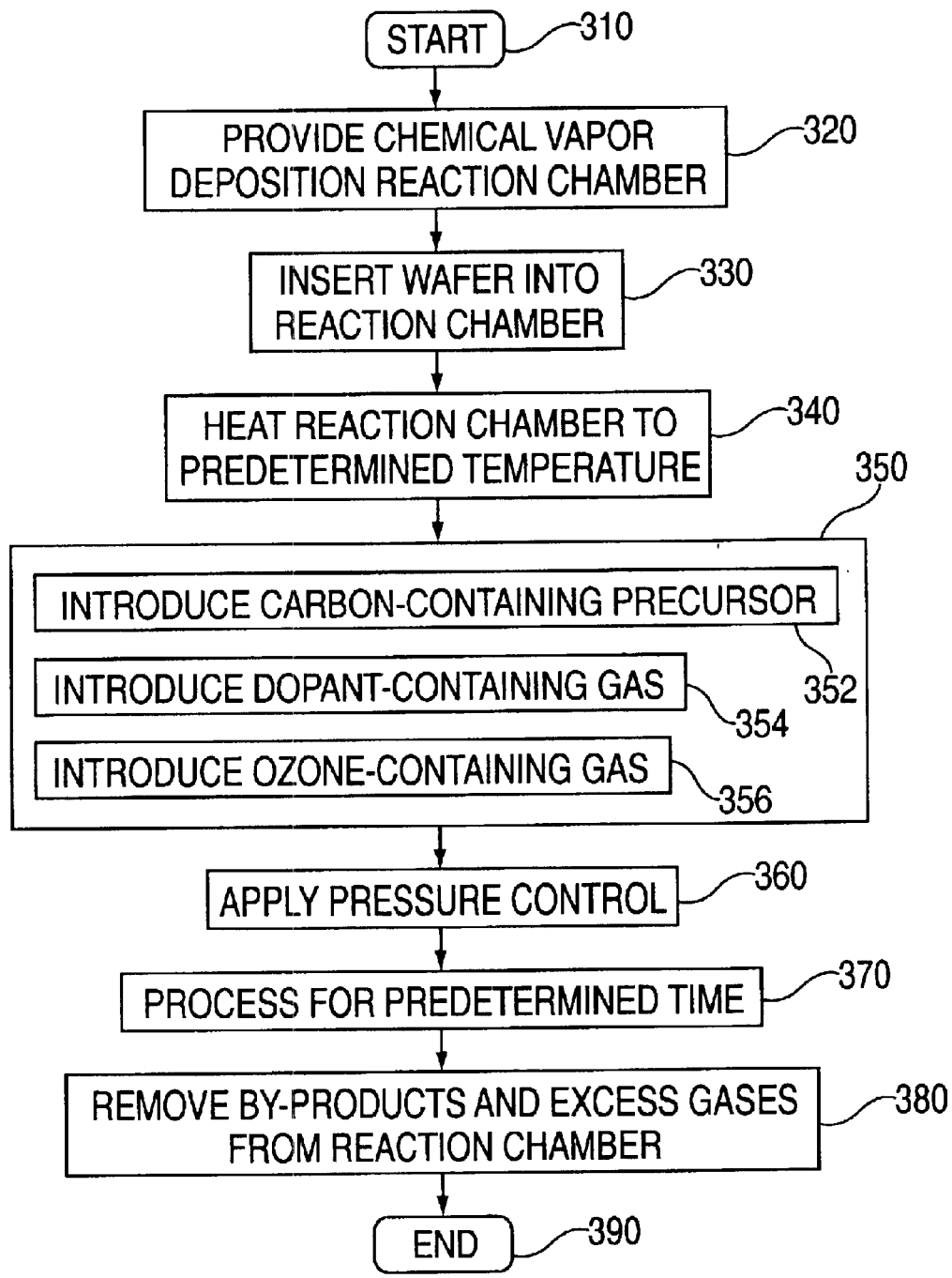
FIG. 3 is a flow chart showing the steps of a preferred embodiment for depositing a pre-metal dielectric layer in accordance with the present invention.
Figure 4:
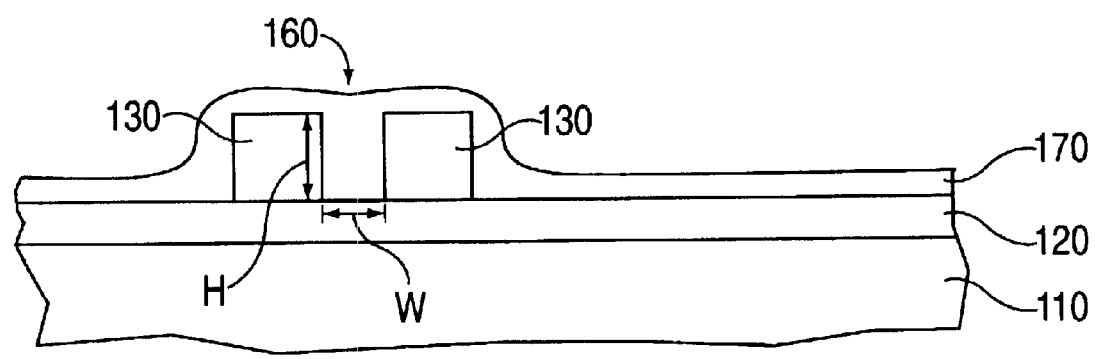
FIG. 4 illustrates a pre-metal dielectric layer formed in accordance with the present invention, having good gap fill characteristics.

Referring to FIG. 2 and FIG. 3, the method in accordance with the present invention can be performed in a conventional single wafer CVD reactor 200 shown in FIG. 2, which is provided as in Process Step 320 in FIG. 3. In Process Step 330, a wafer 210 is provided, which may have semiconductor device features on it, and is placed within the reactor 200 on a platform 220 which includes a heating element therein (not shown), controlled by a heater suscepter 230 which is used to control the temperature within the reactor 200. All reactor components are maintained at predetermined temperatures as indicated by Process Step 340 of FIG. 3. In accordance with the present invention, flow of reaction gases is supplied in Process Step 350, including at least a carbon-containing organometallic precursor 260 (Process Step 352), a mixture of oxygen and ozone 270 (Process Step 356), and a source of dopants 280 (Process Step 354), is supplied to a pre-mixing chamber 250, and the mixture of gases is applied to the wafer 210. In the preferred embodiment of the present invention, improved gap-filling results have been obtained by premixing the gases within a pre-mixing chamber 250 which acts to initiate the reaction and obtain the desired film properties. Alternatively, the gases can be released separately into the reactor volume without premixing, but at a predetermined distance from the wafer surface, for example about 50–500 mils (about 0.05–0.5 inches). However, this post-mixing alternative will result in a film having less than optimal properties. A pump 240 is used to control and maintain the pressure within the reactor 200 to a predetermined pressure (Process Step 360). The gas mixture is applied to the wafer for a redetermined time (Process Step 370) to form the blanket low-k dielectric layer 170 which has good gap-fill characteristics, as shown in FIG. 4. Finally, in Process Step 380, any excess gases are removed from the chamber.

The carbon-containing precursor is preferably TMCTS, but could be any carbon-containing precursor such as OMCTS or the like. The source of dopants could include triethylphosphate (TEPO) which is a source of phosphorous, and triethylborate (TEB) which is a source of boron. The presence of phosphorous as a dopant has the benefit of gettering for alkali elements such as sodium. A phosphorous dopant also tends to lower the reflow temperature, but is typically not sufficient by itself to reduce the reflow temperature so that thermal damage is avoided. In the preferred embodiment of the present invention, the additional dopant, boron, is added to lower the temperature at which reflow can occur in order to avoid thermal damage. Dopants added for the purpose of lowering the reflow temperature in accordance with the present invention could include, but are not limited to, boron, germanium, arsenic, fluorine or combinations thereof. Germanium may be supplied by a precursor such as tetramethylgermane, or the like. Arsenic may be supplied by a precursor such as tetramethylarsine, or the like. Fluorine may be supplied by fluorinated analogs of TMCTS, or the like.

Process conditions for this embodiment include a temperature in the range of about 100–700° C., preferably from about 500–600° C. The pressure in accordance with the present invention is in the range of 50–800 Torr, preferably from about 200–700 Torr. The best results are expected using pressures of about 600–700 Torr. However, pressures as low as 200 Torr may be used. The process includes flow of a gas comprising a mixture of oxygen ($O_2$) and ozone ($O_3$) in the range of 1000–10000 sccm, preferably about 5000 sccm, and where the concentration of ozone ($O_3$) in the $O_2$ flow is between about 5–20 wt %, preferably about 15 wt %. TMCTS flow is in the range of about 100–10000 mgm, preferably about 100–500 mgm. The triethylborate (TEB) flow is in the range of about 100–500 sccm, and the triethylphosphate (TEPO) flow is in the range of about 10–100 sccm. The preferred resulting PMD low-k dielectric layer should have a boron concentration from about 0–6%, and preferably about 4%, and have a phosphorous concentration from about 2–5%, and preferably about 4%.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for depositing a dielectric film comprising the steps of:

providing a chemical vapor deposition (CVD) reaction chamber;

providing a semiconductor wafer within said reaction chamber, said wafer having features on a surface of said wafer, wherein said features are spaced to form at least one gap between said features;

providing a carbon-containing organometallic precursor;

providing an ozone-containing gas;

providing a dopant-containing gas;

reacting said precursor, said ozone-containing gas and said dopant-containing gas, to deposit a low-k film on said surface; and reflowing said low-k film at a temperature less than about 725° C. for about 20 minutes, so that said low-k film fills said at least one gap.

2. The method of claim 1 wherein said gap has an aspect ratio greater than about 3.

3. The method of claim 1 wherein said low-k film has a dielectric constant of less than about 3.

4. The method of claim 1 wherein said CVD reaction chamber is a single wafer reactor.

5. The method of claim 1 further comprising the step of premixing said carbon-containing organometallic precursor, said ozone-containing gas and said dopant-containing gas prior to said step of reacting.

6. The method of claim 1 wherein said step of reacting comprises thermal sub-atmospheric pressure chemical vapor deposition.

7. The method of claim 1 wherein said carbon-containing precursor is elected from the group consisting of TMCTS and OMCTS.

8. The method of claim 1 wherein said step of providing a carbon-containing precursor comprises TMCTS flow between about 100 to about 10,000 mgm.

9. The method of claim 1 wherein said step of providing a carbon-containing precursor comprises TMCTS flow between about 100 to about 500 mgm.

10. The method of claim 1 wherein said step of providing an ozone-containing gas comprises flow of a mixture of oxygen and ozone from about 1000 to about 10,000 sccm.

11. The method of claim 10 wherein said ozone is between about 5 to 20 wt % of said mixture of oxygen and ozone.

12. The method of claim 10 wherein said ozone is about 15 wt % of said mixture of oxygen and ozone.

13. The method of claim 1 wherein said step of providing an ozone-containing gas comprises flow of a mixture of oxygen and ozone of about 5000 sccm.

14. The method of claim 13 wherein said ozone is between about 5 to 20 wt % of said mixture of oxygen and ozone.

15. The method of claim 13 wherein said ozone is about 15 wt % of said mixture of oxygen and ozone.

16. The method of claim 1 wherein said step of providing a dopant-containing gas comprises TEB flow and TEPO flow.

17. The method of claim 16 wherein said TEB flow is between about 100 to about 500 sccm and said TEPO flow is between about 10 to about 100 sccm.

18. The method of claim 1 wherein said dopant-containing gas includes a dopant selected from the group consisting of phosphorus, boron, germanium, arsenic, fluorine and a combination thereof.

19. The method of claim 1 wherein said dopant-containing gas include phosphorous and further includes a second dopant selected from the group consisting of boron, germanium, arsenic, fluorine and a combination thereof.

20. The method of claim 1 further comprising the step of pre-heating said reactor to a predetermined temperature following said step of providing a wafer.

21. The method of claim 20 wherein said predetermined temperature is between about 100–700° C.

22. The method of claim 1 wherein said step of reacting said precursor further comprises achieving and maintaining a predetermined pressure.

23. The method of claim 22 wherein said predetermined pressure is between abou 50 to about 800 Torr.

24. The method of claim 22 wherein said predetermined pressure is between abou 200 to about 700 Torr.

25. A method for depositing a dielectric film comprising the steps of:

providing a chemical vapor deposition (CVD) reaction chamber;

providing a semiconductor wafer within said reaction chamber;

providing a semiconductor wafer within said reaction chamber, said wafer having features on a surface of said water, wherein said features are spaced to form at least one gap between said features;

preheating said reaction chamber to a predetermined temperature of about 500–600° C.;

providing a carbon containing organometallic precursor selected from the group consisting of TMCTS and OMCTS;

providing an ozone-containing gas flowing at about 5000 sccm, wherein said ozone containing gas comprises oxygen and ozone, wherein said ozone has a concentration of about 15 wt %;

providing a dopant-containing gas including TEB flowing between about 100–500 sccm and TEPO flowing between about 10–100 sccm; and reacting said precursor, said ozone-containing gas and said dopant-containing gas at a pressure between about 200–700 Torr to deposit a low-k film on said surface, so that said low-k film substantially fills said at least one gap.

26. The method of claim 25 further comprising the step of premixing said carbon-containing organometallic precursor, said ozone-containing gas, and said dopant-containing gas prior to said step of reacting.

27. The method of claim 25 wherein said gap has an aspect ratio greater than about 3.

28. The method of claim 25 wherein said low-k film has a dielectric constant of less than about 3.

29. The method of claim 25 further comprising the step of reflowing said low-k film.

30. The method of claim 29 wherein said step of reflowing is performed at a temperature less than about 725° C. for about 20 minutes.

* * * * *